United States Patent [19]

Tsuda

[11] 4,041,399

[45] Aug. 9, 1977

[54] SEMICONDUCTOR VARACTOR DEVICE AND ELECTRONIC TUNER USING SAME

[75] Inventor: Yukio Tsuda, Machida, Japan

[73] Assignee: Sony Corporation, Tokyo, Japan

[21] Appl. No.: 686,782

[22] Filed: May 17, 1976

[30] Foreign Application Priority Data

May 20, 1975 Japan .................................. 50-59859

[51] Int. Cl.² .................... H04B 1/08; H01L 29/93
[52] U.S. Cl. ................................. 325/357; 325/464; 334/15; 357/14; 357/53
[58] Field of Search ............... 357/14, 53, 48; 334/15; 325/422, 464, 357

[56] References Cited

U.S. PATENT DOCUMENTS

| 3,597,706 | 8/1971 | Kibler ............................ 357/47 X |
| 3,654,498 | 4/1972 | Chapron ........................ 357/14 X |
| 3,657,609 | 4/1972 | Oswald et al. ................. 357/14 X |
| 3,754,170 | 8/1973 | Tsuda et al. ................... 357/48 X |

Primary Examiner—Paul L. Gensler
Attorney, Agent, or Firm—Lewis H. Eslinger; Alvin Sinderbrand

[57] ABSTRACT

A varactor device comprised of plural varactor elements disposed in a semiconductor body, each varactor element includes first and second semiconductor regions defining a PN junction therebetween. Any two of the varactor elements in the semiconductor body are separated from each other by semiconductor material of one conductivity type. Electrodes are provided on the semiconductor material of one conductivity type and on the plural varactor elements. Individual conductors are provided on the respective electrodes. In accordance with this construction, the electrodes on the semiconductor material are adapted to be supplied with a predetermined potential to substantially shield the varactor elements and minimize stray capacitance therebetween.

In one preferred application of the varactor device, it is used with a tuner, such as a UHF tuner, such that the variable capacitance of the varactor device changes the frequency to which the tuner is tuned. The tuner includes electrical shielding members which are mechanically coupled to, and in electrical contact with the semiconductor body of the varactor device. An electrical conductor connects at least one of the varactor electrodes to a respective signal processing stage in the tuner.

15 Claims, 9 Drawing Figures

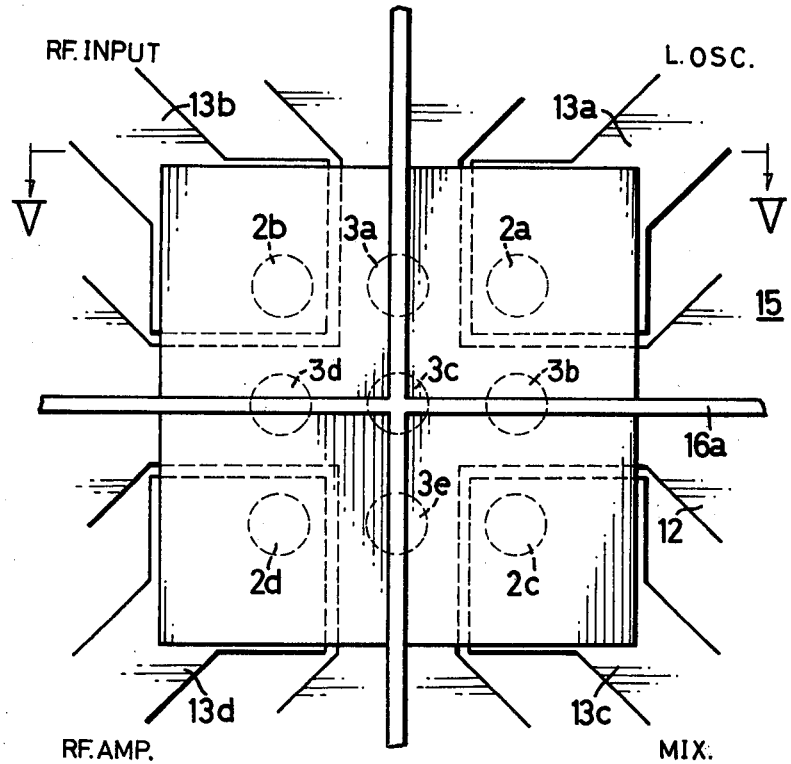
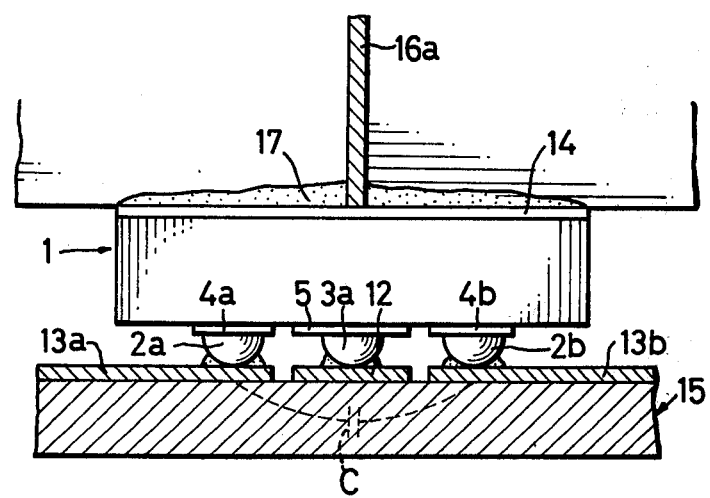

SEMICONDUCTOR VARACTOR DEVICE AND ELECTRONIC TUNER USING SAME

BACKGROUND OF THE INVENTION

This invention relates to a varactor device of the type which can be used in an electronic tuner and, more particularly, to a semiconductor varactor device wherein plural varactor elements are formed in a common semiconductor body for improved shielding and minimal stray capacitance therebetween, the semiconductor varactor device being used as a component in a tuner, such as a UHF tuner.

In a conventional frequency tuner, such as the type used to receive broadcast frequencies in, for example, the UHF, VHF or FM band, it is necessary to vary the resonant frequency of the tuner in order to select a desired broadcast frequency. Typically, variable capacitor devices are used to adjust the frequency to which the tuner is tuned. Such variable capacitor devices have been the so-called air capacitor and, more recently, the varactor. A varactor is a voltage-controlled capacitive element whose capacitance is dependent upon a control voltage applied thereto. Thus, when the varactor is used as the resonant tuning element in a tuner, the frequency to which that tuner is tuned can be changed, or selected, by applying an appropriate control voltage to the varactor.

One problem in using varactors in high frequency tuners, such as a UHF tuner, is shielding the varactor from stray voltages which may deleteriously influence the effective capacitance thereof. Another problem has been minimizing stray capacitance between plural varactors when such plural varators are used to tune various signal processing stages in the tuner. For example, a typical tuner may include an RF input stage, an RF amplifying stage, a local oscillating stage and a mixing stage. Some or all of these stages may be provided with an individual varactor element to be properly tuned to a selected frequency. Stray capacitances associated with these varactor elements tend to result in improper tuning of the tuner. This makes it difficult for a tuner to be used with automatic tuning apparatus without the intervention of a human operator.

Yet another problem attending the use of varactor devices in frequency tuners has been the requirement heretofore of highly skilled technicans to assemble such tuners. That is, in using the varactor elements to control the tuning frequency of the tuner, a common control voltage generally is applied to all of the varactor elements. This means that the voltage capacitance characteristic of the varactor elements should be equal to each other. It has been found that a 2 to 3% deviation in the capacitance characteristic throughout the control voltage range is tolerable. However, since varactor devices which have been used heretofore may exhibit substantial differences in their voltage-capacitance characteristics, even if such varactor elements are manufactured from the same conductor wafer, it has been necessary to test individual varactor elements to obtain a matched set for use in a particular tuner. This laborious task of testing, as well as the assembly process, has resulted in generally high manufacturing costs for such tuners.

OBJECTS OF THE INVENTION

Therefore, it is an object of the present invention to provide an improved varactor device having plural varactor elements of substantially equal voltage-capacitance characteristics.

Another object of this invention is to provide an improved varactor device including plural varactor elements wherein shielding therebetween is maximized and stray cpacitance associated with the elements is minimized.

A further object of this invention is to provide an improved varactor device which can be used advantageously with a tuner.

An additional object of this invention is to provide an improved tuner including a varactor device having plural varactor elements to control the frequency to which the tuner is tuned.

Yet another object of this invention is to provide an improved tuner and varactor device used therewith which can be manufactured and assembled by automated mass production techniques.

A still further object of this invention is to provide an improved tuner and varactor device having relatively low manufacturing costs while exhibiting improved frequency selection characteristics.

Various other objects, advantages and features of this invention will become readily apparent from the ensuing detailed description, and the novel features will be particularly pointed out in the appended claims.

SUMMARY OF THE INVENTION

In accordance with the present invention, a varactor device is provided having plural varactor elements disposed in a semiconductor body, each element including first and second semiconductor regions of opposite conductivities defining a PN junction therebetween, any two of the varactor elements being separated from each other by semiconductor material of one conductivity type; electrodes are provided on the semiconductor material of one conductivity type and also on the plural varactor elements, and individual conducting nodules are provided on the respective electrodes so that any two nodules on the varactor electrodes are separated from each other by a nodule on the semiconductor material electrode, thereby shielding the varactor elements and minimizing stray capacitance therebetween.

In accordance with one aspet of this invention, the varactor device is used in an electronic tuner of the type having signal processing stages electrically shielded by shielding members, the shielding members being mechanically coupled to, an in electrical contact with, a conductive layer provided on an opposite surface of the semiconductor body of the varactor device. A printed circuit board is provided with conductor elements to provide electrical connections between respective varactor elements and associated signal processing stages in the tuner.

BRIEF DESCRIPTION OF THE DRAWINGS

The following detailed description, given by way of example, will best be understood in conjunction with the accompanying drawings in which:

FIG. 4 is a plan view illustrating how the varactor device can be used with the electronic tuner shown in FIGS. 3A and 3B;

FIG. 5 is a cross-sectional view taken along lines V—V of FIG. 4;

DETAILED DESCRIPTION OF SOME OF THE PREFERRED EMBODIMENTS

Figure 1:
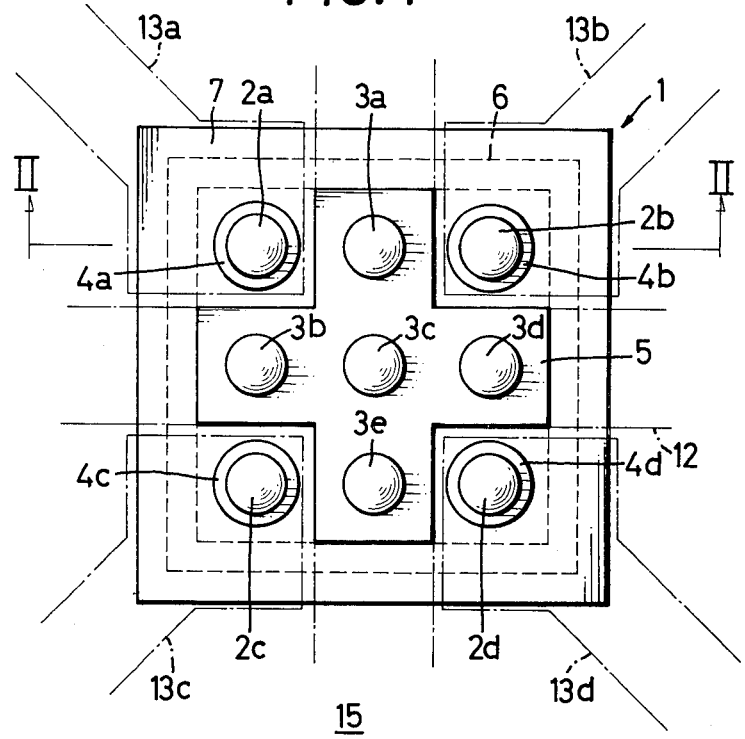
FIG. 1 is a plan view of a varactor device in accordance with this invention.
Figure 2:
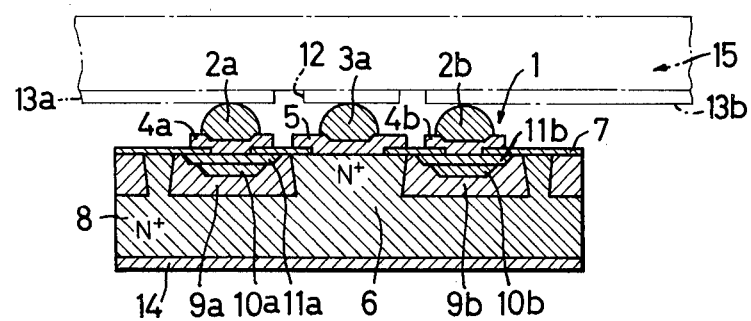
FIG. 2 is a cross-sectional view of the varactor device taken along lines II—II of FIG. 1.

Referring now to the drawings, wherein like reference numerals are used throughout to identify like component elements, and in particular to FIGS. 1 and 2, a varactor device in accordance with the present invention is illustrated. As best seen in FIG. 2, the varactor device 1 is comprised of a semiconductor body 8, such as a substrate formed of an N+ type single crystal having one surface thereof covered with an insulating layer 7 such as silicon dioxide. Plural varactor elements are provided in substrate 8, each varactor element being formed in an N-type semiconductor region 9a, 9b and including semiconductor regions 10a, 10b and 11a, 11b of opposite conductivites. As shown, regions 10a, 10b are of N+ conductivity and regions 11a, 11b are of P+ conductivity. As best seen from FIG. 2, the respective varactor elements are separated from each other by N+ semiconductor material 6 which, for example, is part of substrate 8.

Individual electrodes 4a, 4b, 4c and 4d (FIG. 1) are provided electrical contact with the upper-most P+ semiconductor region 11a, 11b, . . . , of the varactor elements. These electrodes 4a, 4b, 4c and 4d may be of circular shape and formed of conductive material such as aluminum, titanium, nickel, or the like.

An electrode 5 is provided in contact with the one surface of substrate 8, as shown in FIG. 2, and extends over the semiconductor material 6 which separates the respective varactor elements from each other. Hence, for an embodiment wherein four varactor elements are provided in substrate 8, electrode 5 exhibits a cross-shape, as shown in FIG. 1.

Individual conductors 2a, 2b, 2c and 2d are provided on varactor electrodes 4a, 4b, 4c and 4d, respectively, and similar individual conductors 3a . . . 3e are provided on electrode 5 at the position shown in FIG. 1. Preferably, conductors 2a, . . . 2d and 3a . . . 3e are conductive nodules positioned such that any two of the nodules on the varactor electrodes are separated by a nodule on electrode 5. When a reference potential, such as ground, is applied to electrode 5 through any one or more of nodules 3a, . . . 3e, the illustrated configuration provides effective shielding of the respective varactor elements and minimizes stray capacitance therebetween.

At the opposite surface of substrate 8, that is, the lower surface of the substrate as viewed in FIG. 2, a conductive metallic layer 14 is deposited.

Varactor device 1 is adapted to be electrically connected to further apparatus by, for example, a printed circuit board 15. For this purpose, the respective electrodes 4a, . . . 4d and 5 all are aligned in a plane substantially coextensive with the upper surface of substrate 8. Hence, for the purpose of this description, the electrodes and nodules thereon may be considered to be provided on the upper surface of the semiconductor substrate.

As depicted in broken lines in FIG. 2, and described in greater detail below, printed circuit board 15 is comprised of a suitable non-conducting support, such as an insulating or dielectric support, having individual conductors, such as conductor strips 12, 13a, 13b, 13c and 13d thereon. Conductor 12 is adapted to contact one or more of nodules 3a, . . . 3e and, therefore, may exhibit a cross-shape similar to the shape of electrode 5. Conductors 13a, 13b, 13c and 13d are adapted to contact individual nodules 2a, 2b, 2c and 2d, respectively, of the respective varactor elements. Hence, the conductors of printed circuit board 15 may be bonded to the illustrated nodules of varactor device 1 by the so-called face-down bonding technique. It may be appreciated that the aforementioned reference potential can be supplied to electrode 5 via conductor 12. The respective varactor elemets can be electrically connected to individual circuits by the corresponding conductors 13a, . . . 13d.

One advantage of the face-down bonding technique for bonding the respective nodules 2a, . . . 2d and 3a, . . . 3e to the conductors on printed circuit board 15 is to provide a relatively high bonding strength therebetween. Also, since the use of conductive lead wires is obviated, there is virtually no parasitic inductance present in varactor device 1 and, also, resistance at the connections between printed circuit board 15 and varactor device 1 is minimized. Moreover, since semiconductor material 6 underlying electrode 5 is highly doped, the resistance between electrode 5 and each of electrodes 4a, 4b, 4c and 4d is substantially reduced.

Since the varactor elements shown in FIGS. 1 and 2 are formed adjacent each other, their respective voltage-capacitance characteristics are substantially equal.

Figure 3A:
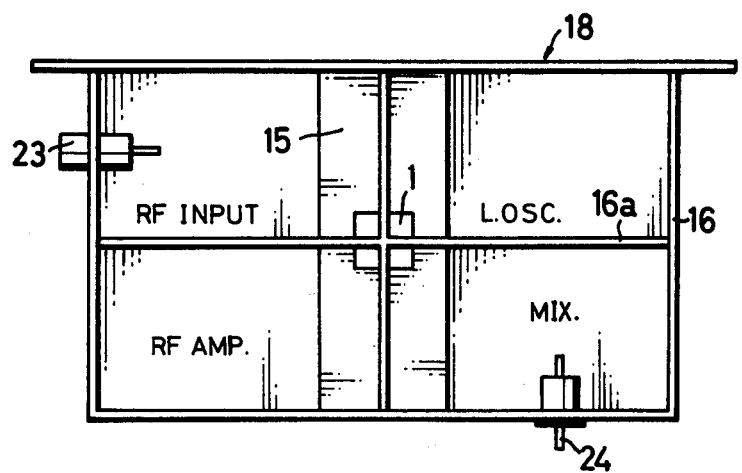
FIG. 3A is a plan view of the chassis of an electronic tuner with which the varactor device can be used.
Figure 3B:
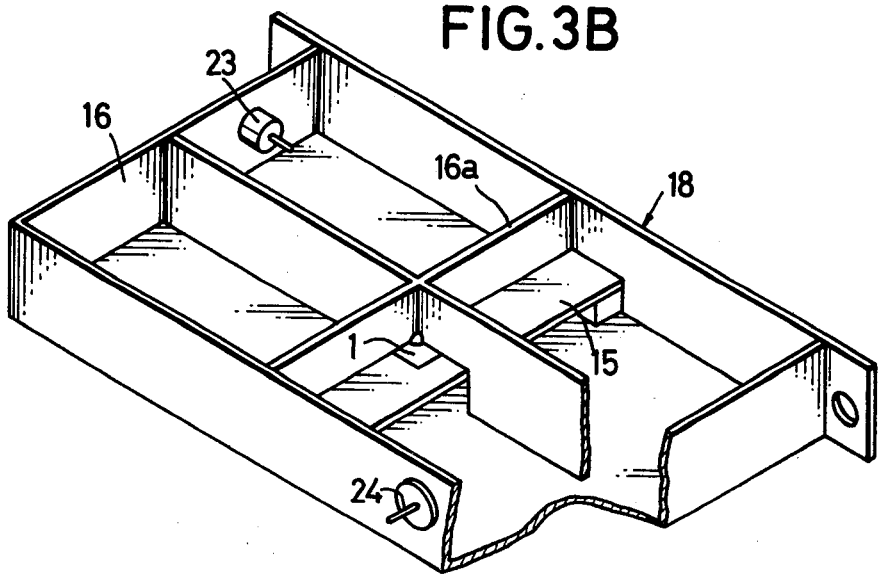
FIG. 3B is a perspective view of the chassis of the electronic tuner shown in FIG. 3A.

The varactor device shown in FIGS. 1 and 2 finds ready application in an electronic tuner, such as a UHF tuner. A typical tuner includes an RF input stage, an RF amplifier stage, a local oscialltor stage and a mixing stage wherein the local oscillating signal and amplified RF signal are mixed to produce an intermediate frequency output signal. Such signal processing stages are conventional and form no part of the present invention per se. Preferably, these stages should be shielded from each other in the tuner structure. Accordingly, a typical chassis 18 which can be used to support such a tuner is shown in FIGS. 3A and 3B. Chassis 18 is provided with a peripheral shielding wall 16 and intersecting shielding members 16a to define individual compartments, or cavities, for the respective RF input, RF amplifier, local oscillator and mixing stages, as shown. The RF input stage is provided with an input terminal 23 to receive signals, such as broadcast signals, and the mixing stage is provided with an output terminal 24 from which the intermediate frequency signal is derived. As shown in FIGS. 3A and 3B, and in greated detail in FIGS. 4 and 5, varactor device 1 is mechanically and electrically coupled to the intersecting portions of shielding members 16a, and printed circuit board 15 serves to connect the respective varactor electrodes to corresponding ones of the stages included in the tuner. It is recalled that printed circuit board 15 also is adapted to supply a reference potential, such as ground, to electrode 5.

Referring to FIGS. 4 and 5, conductive layer 14 on the lower surface of substrate 8 (FIG. 2) is connected to the intersecting portions of shielding members 16a, as by soldering thereto, or by a conductive resin 17. Preferably, if conductive resin 17 is used, the shielding of the respective varactor elements can be further improved if ground potential is applied thereto through shielding member 16a. It is appreciated that varactor device 1 of FIG. 2 is inverted in the illustrations of FIGS. 4 and 5. Preferably, the cross-shape electrode 5 is aligned with the cross-shape formed by the intersecting portions of shielding member 16a.

As shown, nodule 2a of electrode 4a is bonded to conductor 13a on one surface of printed circuit board 15. Conductor 13a interconnects this varactor element to the resonant circuit included in the local oscillating stage. Similarly, conductor 13b on printed circuit board 15 interconnects the varactor element associated with electrode 4b and nodule 2b to the RF input stage of the tuner. Also, conductors 13c and 13d connect the varactor elements provided with nodules 2c and 2d to the mixing and RF amplifier stages, respectively, of the tuner.

Figure 8:
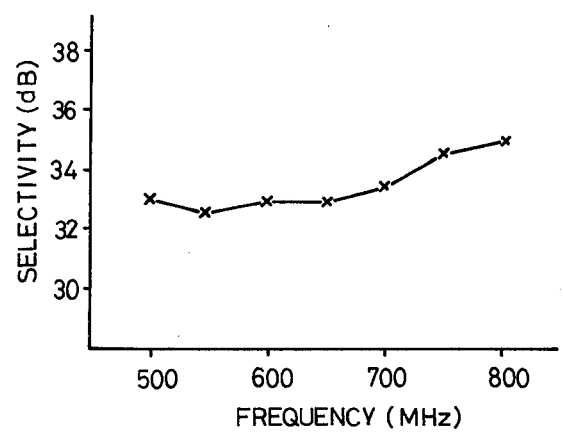
FIG. 8 is a graphical representation of the frequency selectivity of the electronic tuner used with the varactor device in accordance with this invention.

When ground potential is applied through shielding member 16a to conductive layer 14 and, additionally, when ground potential is applied through conductor 12 to electrode 5 of varactor device 1, no potential difference appears between any two of the varactor electrodes 4a, 4b, 4c and 4d. Also, as noted above, stray capacitance between the electrodes is thus minimized. Furthermore, by applying ground, or other reference potential, to shielding member 16a, the shielding, or electrical separation, between the respective stages of the tuner is improved. Hence, the improved tuner, when used with varactor device 1, exhibits a frequency-selectivity characteristic that is relatively high over a given frequency range, such as the UHF band. This is shown in FIG. 8 wherein the frequency-selectivity characteristic is greater than 30db throughout the UHF band. Also, since the voltage-capacitance characteristics of the varactor elements are substantially equal to each other, the resonant frquencies to which the respective stages in the tuner are tuned can be adjusted at substantially the same rate by using a common control voltage applied to all of the varactor elements. It is appreciated that this reduces the complexity of the tuner and tuner control apparatus.

Printed circuit board 15, shown in FIG. 5, may be of the type typically used with hybrid IC devices. When used in a tuner adapted for a higher frequency band, such as the UHF band, the printed circuit board generally is formed of aluminaceramics. However, the dielectric constant of alumina-ceramics is very large. Hence, as diagrammatically represented in FIG. 5, the stray capacitance C through the alumina-ceramics between adjacent varactor electrodes, such as electrodes 4a and 4b, must be taken into account. This stray capacitance tends to degrade the electrical separation between respective signal processing stages in the tuner. This disadvantage is substantially overcome by the embodiment shown in FIGS. 6 and 7. In this embodiment, varactor device 1 and the tuner structure are substantially the same as described hereinabove. However, printed circuit board 15 is modified.

Figure 6:
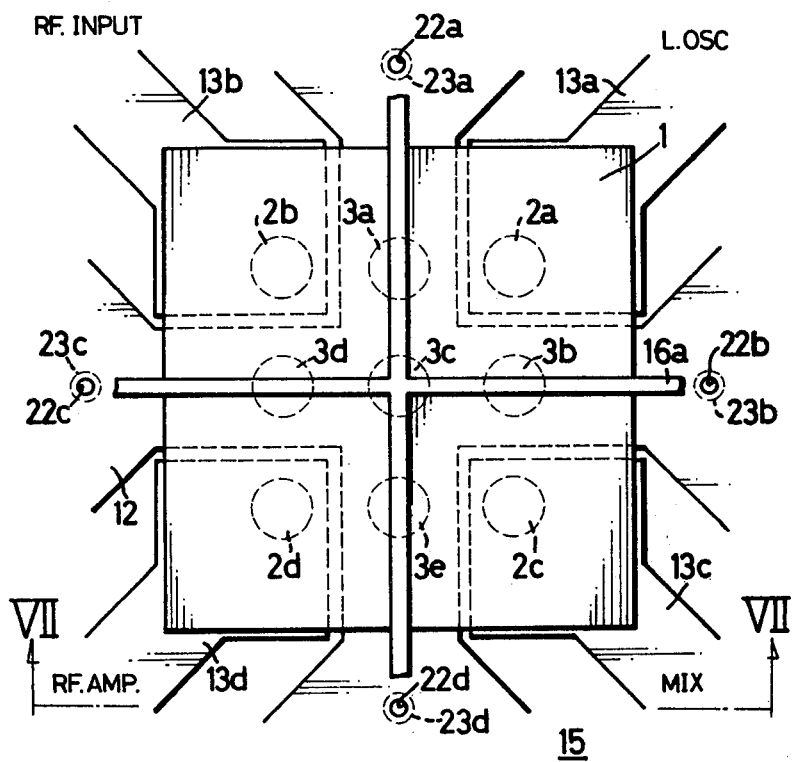
FIG. 6 is a plan view of another embodiment showing how the varactor device can be used with the tuner of FIGS. 3A and 3B.
Figure 7:
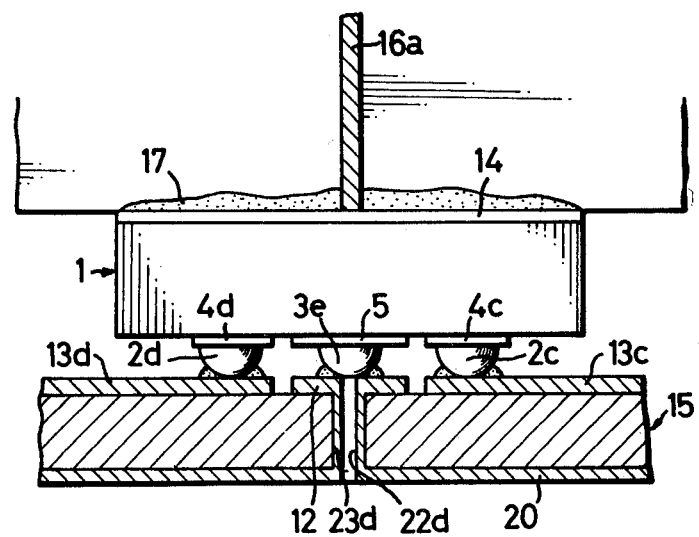
FIG. 7 is a cross-sectional view taken along lines VII—VII of FIG. 6.

In the modified printed circuit board shown in FIGS. 6 and 7, one surface of the dielectric support is provided with conductors 12, 13a, 13b, 13c and 13d, as in the previously described embodiment. In addition, the other surface of the printed circuit board is provided with a layer of conductive material 20. In addition, electrical connections are provided through the printed circuit board to electrically connect conductive layer 20 with conductor 12. As one example of such electrical connections, holes 22a, 22b, 22c and 22d are provided at the respective end portions of cross-shaped conductor 12. As shown in FIG. 6, holes 22a, ... 22d are aligned with the intersecting shielding members 16a. Each hole is provided with conductive material 23a, ... 23d, respectively, extending therethrough so as to provide an electrical connection beween the respective arms of cross-shaped conductor 12 and conductive layer 20. This conductive material may comprise a conducting post, a conducting sleeve or any suitably deposited conductive material. Hence, by supplying ground potential to conductor 12, conductive layer 20 also is provided with ground potential, thereby substantially removing the stray capacitance C between varactor electrodes 4a, 4b, 4c and 4d, mentioned above. Consequently, the electrical separation between respective signal processing stages in the tuner is further improved.

While the present invention has been particularly shown and described with reference to certain ones of the preferred embodiments, it should be readily apparent that various changes and modifications in form and detail may be made by one of ordinary skill in the art without departing from the spirit and scope of the invention. For example, although varactor device 1 has been described as being comprised of four varactor elements, it is appreciated that the present invention need not only be limited solely to this number of varactor elements. Furthermore, the configuration of such varactor elements need not be limited to the rectangular shape shown in FIGS. 1, 4 and 6. Rather, the varactor elements may be disposed in a row, if desired. Therefore, it is intended that the appended claims be interpreted as including these as well as various other such changes and modifications.

What is claimed is:

1. A varactor device, comprising:
   plural varactor elements each including first and second semiconductor regions of opposite conductivities in a semiconductor body, said first and second regions defining a PN junction therebetween, any two of said varactor elements being separated from each other by semiconductor material of one conductivity type and being electrically isolated from each other;
   electrode means on said semiconductor material of one conductivity type;
   plural electrodes on said plural varactor elements, respectively, each said electrode being in contact with said first semiconductor region; and
   individual conducting means on said electrode means and on said plural electrodes, respectively, said individual conducting means being arranged on a substantially common surface of said varactor device, and any two of said conducting means on said electrodes being separated from each other by said conducting means on said electrode means.

2. The varactor device of claim 1 wherein said semiconductor body is a substrate of said one conductivity type.

3. The varactor device of claim 2 wherein said semiconductor material is a portion of said substrate.

4. A varactor device, comprising:
   a substrate of one conductivity type;
   plural varactor elements each including first and second semiconductor regions of opposite conductivities diffused into one surface of said substrate, said regions defining a PN junction therebetween, any two of said varactor elements being separated from each other by a portion of said substrate;

electrode means on said one surface of said substrate;

plural electrodes on said plural varactor elements, respectively, each said electrode being in contact with said first semiconductor region, said electrode means and said plural varactor electrodes all being aligned in a plane substantially coextensive with said one surface of said substrate;

a conductive metal layer on the other surface of said substrate; and individual conducting means on said electrode means and on said plural electrodes, respectively.

5. The varactor device of claim 4 wherein said individual conducting means comprises conductive nodules disposed substantially in a plane and adapted to be contacted by printed circuit means whereby said electrode means is adapted to be supplied with a predetermined potential to substantially shield said varactor elements and minimize stray capacitance therebetween.

6. The varactor device of claim 5 wherein any two nodules on said varactor electrodes are separated from each other by a nodule on said electrode means.

7. The varactor device of claim 5 wherein said printed circuit means comprises a layer of dielectric material; a first overlying layer of conductive material on one surface of said dielectric material forming a conductor in contact with at least one nodule on said electrode means; and at least one second overlying layer of conductive material on said one surface of said dielectric material forming a conductor in contact with a nodule on a respective varactor electrode.

8. The varactor of claim 7 wherein the other surface of said layer of dielectric material is provided with another layer of conductive material and with means passing through said dielectric material for electrically connecting said first overlying layer of conductive material to said other layer of conductive material.

9. The varactor device of claim 7 further comprising a chassis having electrical shielding means in electrical contact with said conductive metal layer on said other surface of said substrate.

10. The varactor device of claim 9 wherein said chassis is adapted to receive frequency-tuning circuitry; and said shielding means comprises intersecting shielding members, the intersecting portions thereof being in contact with said conductive metal layer.

11. An electronic tuner, comprising:

means for supporting amplifier, oscillator and mixing stages, said means including electrical shielding means;

a varactor device electrically coupled to at least one of said stages for determining the tuning frequency of said tuner, said varactor device including:

plural varactor elements each including first and second semiconductor regions of opposite conductivities in a semiconductor body, said regions defining a PN junction therebetween, any two of said varactor elements being separated from each other by semiconductor material of one conductivity type;

electrode means on said semiconductor material of one conductivity type;

plural electrodes on said plural varactor elements, respectively, each said electrode being in contact with said first semiconductor region; and individual conducting means on said electrode means and on said plural varactor electrodes, respectively;

means for electrically connecting said semiconductor body to said electrical shielding means; and electrical conductor means for connecting at least one of said conducting means on a respective varactor electrode to at least one of said stages.

12. The electronic tuner of claim 11 wherein said invididual conducting means are provided on one surface of said semiconductor body; a conducting layer is provided on the other surface of said semiconductor body, said conducting layer being coupled to said electrical shielding means; and said electrical conductor means comprises a printed circuit board having a conductor in contact with said conducting means on said electrode means to supply a predetermined potential thereto to substantially shield said varactor elements and minimize stray capacitance therebetween, said printed circuit board also having at least one additional conductor for connecting said at least one conducting means on said varactor electrode to said one stage.

13. The tuner of claim 12 wherein said electrical shielding means comprises intersecting shielding members, the intersecting portions thereof being in contact with said conducting layer on said other surface of said semiconductor body and adapted to be supplied with a reference potential.

14. The tuner of claim 13 wherein said individual conducting means comprise individual conducting nodules, any two nodules on said varactor electrodes being separated from each other by a nodule on said electrode means; and wherein said conductor on said printed circuit board in contact with said conducting means on said electrode means comprises intersecting conductor strips in contact wih substantially all of said nodules on said electrode means and in alignment with said intersecting shielding members.

15. The tuner of claim 14 wherein said printed circuit board comprises a dielectric layer having said intersecting conductor strips and said at least one additional conductor on one surface thereof, and having conductive material on the other surface thereof; and means passing through said dielectric layer to electrically connect said intersecting conductor strips to said conductive material.

* * * * *